United States Patent [19]

Nakano

[11] Patent Number: 4,938,703

[45] Date of Patent: Jul. 3, 1990

[54] CONDUCTIVE BOARD SPACER

[75] Inventor: Yoshihito Nakano, Kasugai, Japan

[73] Assignee: Kitagawa Kogyo Kabushiki Kaisha, Japan

[21] Appl. No.: 393,635

[22] Filed: Aug. 14, 1989

[30] Foreign Application Priority Data

Sep. 9, 1988 [JP] Japan .................................. 63-119215

[51] Int. Cl.$^5$ .......................... H01R 9/09; H05K 7/12; F16B 5/06
[52] U.S. Cl. ................................ 439/74; 174/138 D; 361/412
[58] Field of Search .................... 174/138 D; 361/412; 439/66, 74, 75

[56] References Cited

U.S. PATENT DOCUMENTS

| B 404,290 | 1/1975 | Friend . | |
|---|---|---|---|
| 4,470,178 | 9/1984 | Matsui | 174/138 D X |
| 4,664,458 | 5/1987 | Worth | 174/138 D X |

FOREIGN PATENT DOCUMENTS

| 0204435 | 12/1986 | European Pat. Off. . |
| 1229668 | 4/1971 | United Kingdom . |
| 2142377 | 1/1985 | United Kingdom . |

Primary Examiner—Laramie E. Askin
Attorney, Agent, or Firm—Oliff & Berridge

[57] ABSTRACT

A conductive spacer (1) comprises a spacing member (4) and upper and lower fixing members (7,8) to secure upper and lower boards (5,6) a certain distance apart. The upper and lower fixing members (7,8) include upper and lower supporting members (9, 17a,17b) for pressing against the inner surfaces of the upper and lower boards (5,6), and upper and lower locking members (12a,12b,19a,19b) extending from the center of the upper and lower supporting members (9,17a,17b) for passing through holes (34,35) in the upper and lower boards (5,6), resiliently expanding outward, and for securing outer surfaces of the upper and lower boards (5,6). The upper and lower fixing members (7,8) and the upper and lower locking members (12a,12b,19a,19b) thus support the boards (5,6). One end of a conductive member (3) is attached to the lower supporting members (17a,17b) on the lower board (6), and the other end of the conductive member (3) extends to contact the upper board (5). Since the conductive member (3) thus contacts both boards (5,6), it makes a circuit and grounds the boards (5,6) to each other. By inserting the conductive spacer (1) in the holes (34,35) in the boards (5,6), the boards (5,6) are both kept a certain distance apart and grounded.

21 Claims, 11 Drawing Sheets

CONDUCTIVE BOARD SPACER

BACKGROUND OF THE INVENTION

This invention relates to a conductive board spacer for maintaining a space between two boards and for grounding the two boards.

In electric devices, many kinds of parts are set on a board that is then fixed a certain space from a chassis of an electric device. A spacer is used for maintaining the space between the chassis and the board or between two boards. The spacer is usually metallic in order to ground the board to the chassis. One such related-art conductive spacer has a long, hexagonal bolt. The bolt engages screwed holes in the chassis and the board, and nuts screw onto the bolt, thus fixing the conductive spacer to the chassis and the board.

However, since the related-art spacer must be fixed to or disengaged from the chassis and the plate using the nuts, the application of the spacer is troublesome and time-consuming.

SUMMARY OF THE INVENTION

It is an object of the present invention to provide a conductive spacer that easily engages and disengages from two boards.

In order to achieve this object, a conductive board spacer comprises a spacing member and upper and lower fixing members to secure upper and lower boards a certain distance apart. The upper and lower fixing members include upper and lower supporting members for pressing against the inner surfaces of the upper and lower boards, and upper and lower locking members extending from the center of the upper and lower supporting members for passing through holes in the upper and lower boards, resiliently expanding outward, and for securing outer surfaces of the upper and lower boards. The upper and lower fixing members and the upper and lower locking members thus support the boards. One end of a conductive member is attached to the lower supporting member on the lower board, and the other end of the conductive member extends to contact the upper board. Since the conductive member thus contacts both boards, it makes a circuit and grounds the boards to each other. By inserting the conductive spacer in the holes in the boards, the boards are both kept a certain distance apart and grounded.

DESCRIPTION OF THE PREFERRED EMBODIMENTS

Figure 1:
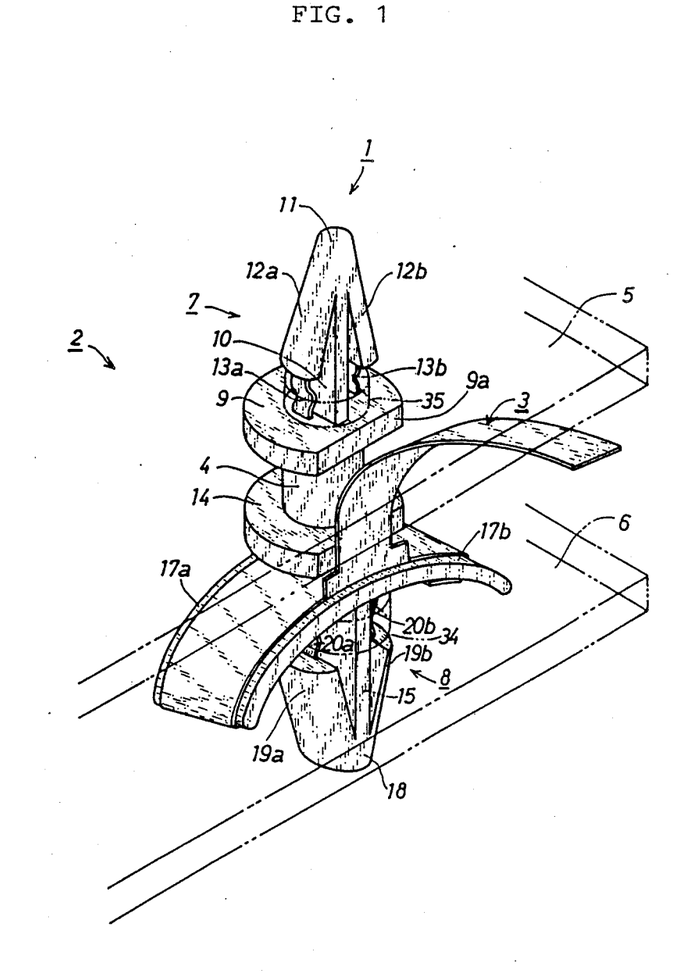
FIG. 1 is a perspective view of a first embodiment of the present invention.
Figure 2:
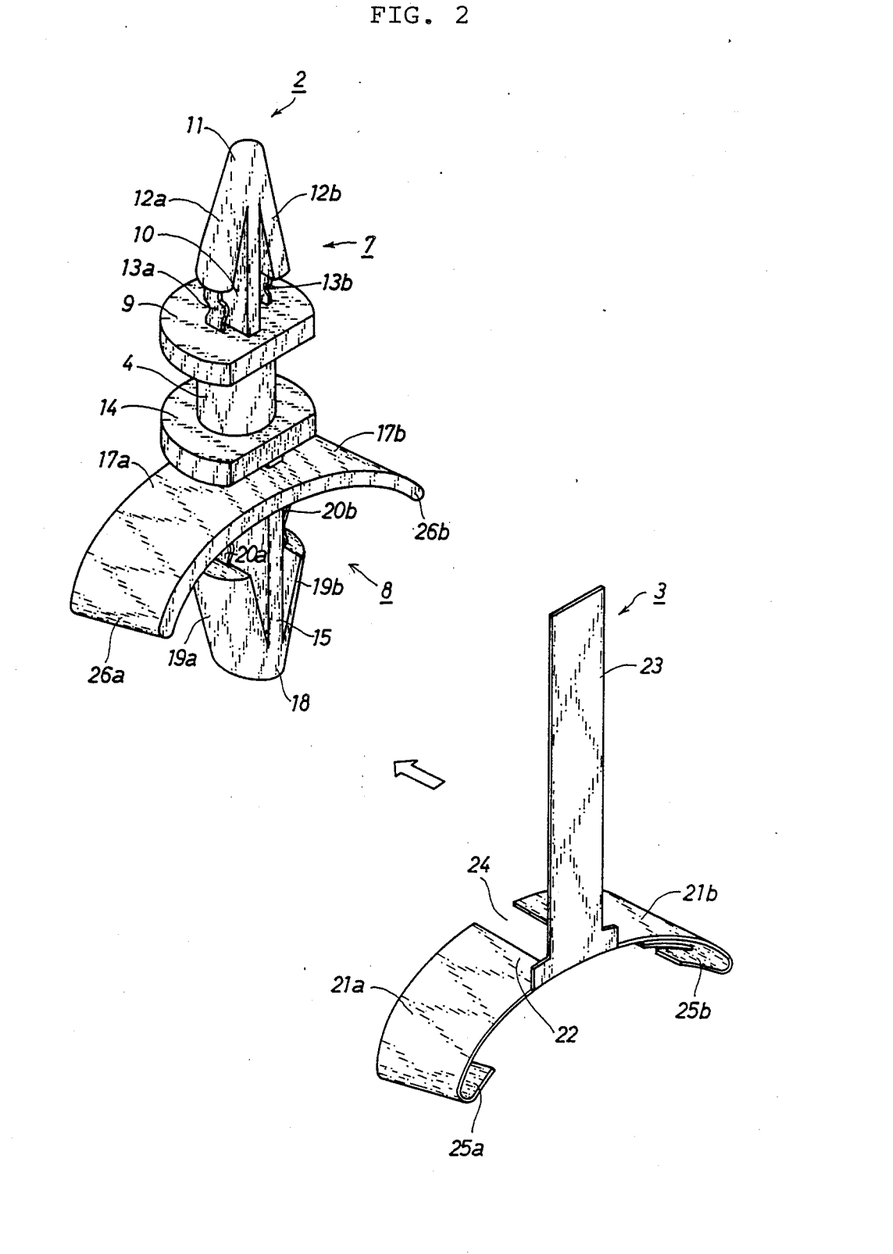
FIG. 2 is an assembly diagram for the conductive spacer of FIG. 1.

The first embodiment is explained referring to FIGS. 1 and 2. As shown in FIG. 1, a conductive spacer 1 is a combination of a spacer body 2 and a conductive member 3 made of copper plate. At the upper and lower ends of a center column 4 of the spacer body 2 are a spindle 7 and an anchor 8 for engaging a panel 5 and a chassis 6, respectively.

At the intersection of the spindle 7 and the column 4, an upper base 9 that is formed as a sword guard has on its periphery a cut plane 9a for facilitating the installation of the conductive member 3. A uniformly thick shaft 10 extends from the center of the upper base 9 along the same axis as the column 4 and connects with arrowhead arms 12a and 12b. The arrowhead arms 12a and 12b spread as they slope from a point 11 downward toward the upper base 9, and connect through strips 13a and 13b to the upper base 9.

Like the spindle 7, the anchor 8 comprises a lower base 14 that is shaped as a sword guard and is partly cut. A uniformly thick shaft 15 extends from the center of the underside of the lower base 14 along the same axis as the column 4. Resilient braces 17a and 17b extend laterally from the shaft 15 and form a circular arc to press against the surface of the chassis 6 when the conductive spacer 1 is attached to the chassis 6. Detent legs 19a and 19b slope upward from a point 18 of the shaft 15 and connect through strips 20a and 20b to the braces 17a and 17b.

As shown in FIG. 2, the conductive member 3 comprises lateral brace clips 21a and 21b, and a vertical contact 23 extending perpendicularly from a clip base 22. The lateral brace clips conductive member 3 is thus Y-shaped. A notch 24 is cut in the clip base 22 to engage the shaft 15 under the lower base 14. Hooks 25a and 25b at the edges of the brace clips 21a and 21b of the conductive member 3 are cut into several narrow strips to fit on the braces 17a and 17b.

When the conductive member 3 is attached to the spacer body 2, the notch 24 in the conductive member 3 engages the shaft 15 between the lower base 14 and the brace clips 21a, 21b. The hooks 25a and 25b are folded to fit edges 26a and 26b and grip the braces 17a and 17b.

When the conductive spacer 1 is used, as shown in FIG. 1, the anchor 8 of the conductive spacer 1 is placed upright in a hole 34 in the chassis 6. When the detent legs 19a and 19b first pass through the hole 34 and then expand outward, the detent legs 19a and 19b press the outer surface of the chassis 6, and the braces 17a and 17b press the inner surface of the chassis 6. The conductive spacer 1 is thus held immobile on the chassis 6 by the braces 17a, 17b and the detent legs 19a, 19b.

Subsequently, a hole 35 in the panel 5 with electrical components is placed over the spindle 7 of the conductive spacer 1 set upright in the chassis 6, and the spindle 7 engages the panel 5. The panel 5 is thus supported firmly between the arrowhead arms 12a, 12b and the upper base 9, secured by the conductive spacer 1.

When the conductive spacer 1 is secure between the panel 5 and the chassis 6, the braces 17a and 17b press the hooks 25a and 25b of the brace clips 21a and 21b of the conductive member 3 against the chassis 6. On the other end, the vertical contact 23 of the conductive member 3 firmly contacts the panel 5 because of its resiliency, and makes an electric circuit connecting the panel 5 and chassis 6.

By inserting the spindle 7 and the anchor 8, respectively, in the holes 34 and 35 in the panel 5 and the chassis 6, the conductive spacer 1 maintains a certain distance between the panel 5 and the chassis 6. Concurrently, the conductive member 3 attached to the conductive spacer 1 makes an electric circuit between the panel 5 and the chassis 6 for grounding. Since the conductive spacer 1 is not fixed to the panel 5 and the chassis 6 using screws as in the prior art, the conductive spacer 1 can be easily attached to and detached from the panel 5 and the chassis 6, thus increasing the operation efficiency. The conductive spacer 1 has a spacer body 2 molded from synthetic resin, and is thus light weight.

Figure 3:
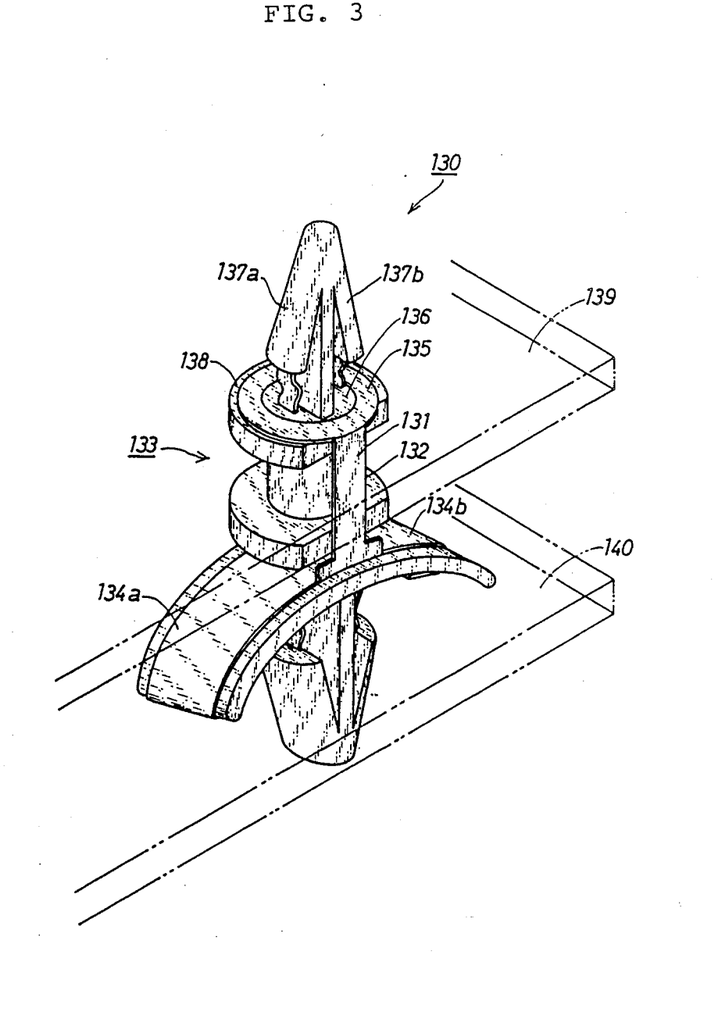
FIG. 3 is a perspective view of a second embodiment.

A second embodiment is explained referring to FIG. 3. A conductive spacer 130 of the second embodiment is different from the spacer 1 of the first embodiment in that the both ends of a vertical contact 132 of a conductive member 131 are fixed onto a spacer body 133. The conductive member 131 has braces 134a and 134b at the lower end of the vertical contact 132 in the same way as the first embodiment. However, the vertical contact 132 has an annular engaging portion 135 at its upper end. When arrowhead arms 137a and 137b pass through a hole 136 in the center of the engaging portion 135, the engaging portion 135 fits on a base 138.

When the conductive spacer 130 is inserted into holes previously formed on the chassis 140 and the panel 139, the braces 134a and 134b of the conductive member 131 press the chassis 140. The base 138 and the panel 139 firmly contact the engaging portion 135. The conductive member 131 can ground the panel 139 to the chassis 140. Since the arrowhead arms 137a and 137b pass through the engaging portion 135 and expand outward, the engaging portion 135 of the conductive member 131 will not easily disengage from the spacer body 133.

Figure 4A:
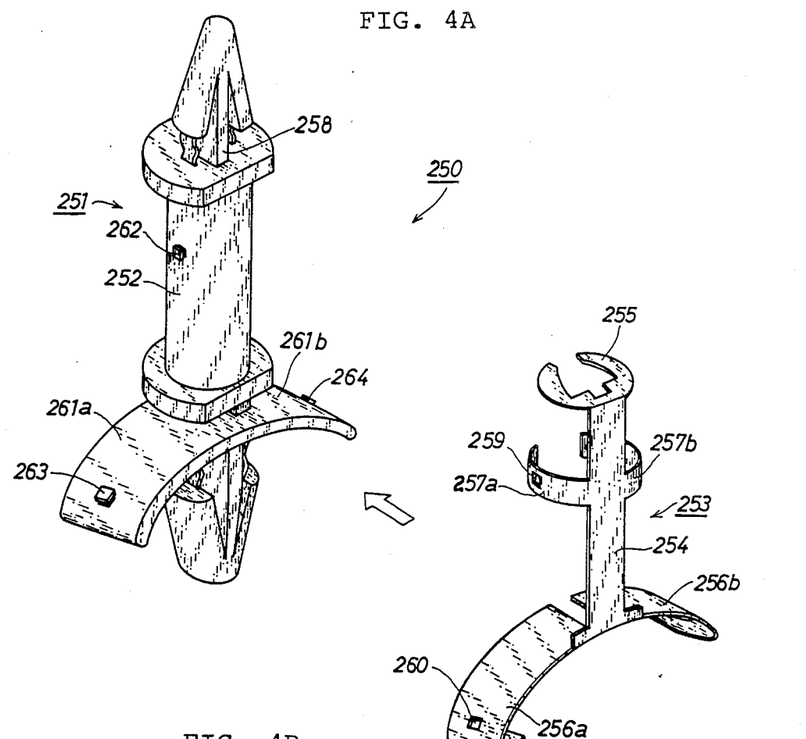
FIG. 4A is an assembly diagram for a third embodiment.
Figure 4B:
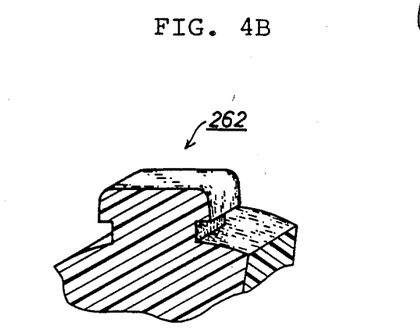
FIG. 4B is a partial sectional view of a projection on a column of the conductive spacer of the third embodiment.

A third embodiment is explained referring to FIGS. 4A and 4B. As shown in FIG. 4A, since a column 252 of a spacer body 251 is long and thick, a conductive spacer 250 for the third embodiment maintains a large distance between two panels (not shown). A vertical contact 254 of a conductive member 253 extends upward to an engaging portion 255 and downward to brace clips 256a and 256b. Arms 257a and 257b extend from a portion just above the center of the vertical contact 254.

The engaging portion 255 is sort of horseshoe-shaped according to the configuration of a shaft 258 of the spacer body 251. The arms 257a and 257b grip the column 252 to secure the conductive member 253 against the spacer body 251. As shown in FIG. 4A buttons 262 (also shown in FIG. 4B) on the column 252 and buttons 263 and 264 on the braces 261a and 261b engage holes 259 in the arms 257a and 257b and holes 260 in the brace clips 256a and 256b, respectively, thus securing the conductive member 253 firmly against the spacer body 251.

Figure 5:
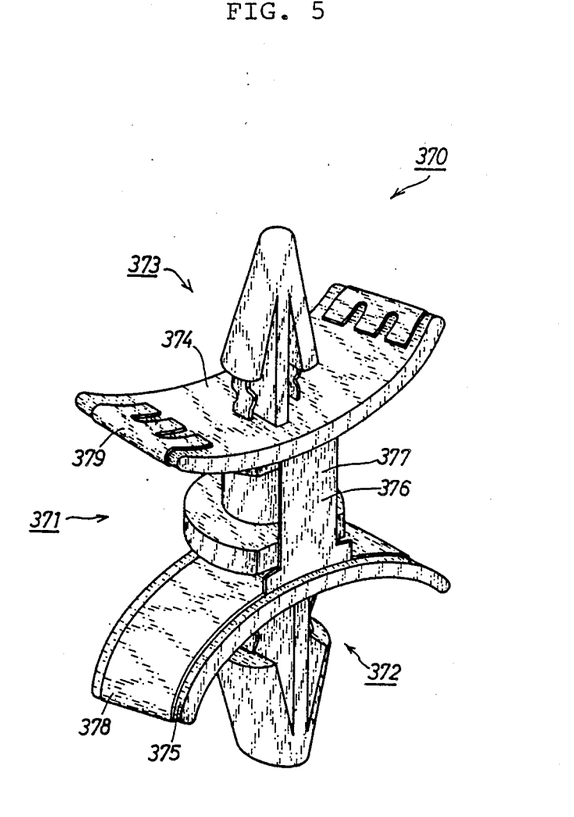
FIG. 5 is a perspective view of a conductive spacer for a fourth embodiment.

A fourth embodiment is explained referring to FIG. 5. A spacer body 371 of a conductive spacer 370 comprises an anchor 372 and a spindle 373. In the same way as in the first embodiment, braces 374 and 375 extend laterally from the spacer body 371. However, brace clips 378 and 379 extend laterally from both the lower and upper ends of a vertical contact 377 of a conductive member 376 to engage the braces 375 and 374, respectively. The conductive member 376 forms a sideways H. Since the brace clips 378 and 379 of the conductive member 376 firmly grip the braces 375 and 374, the conductive member 376 will not easily disengage from the spacer body 371. The edges of the brace clips 378 and 379 press against the lower and upper panels (not shown), thus grounding the panels.

Figure 6:
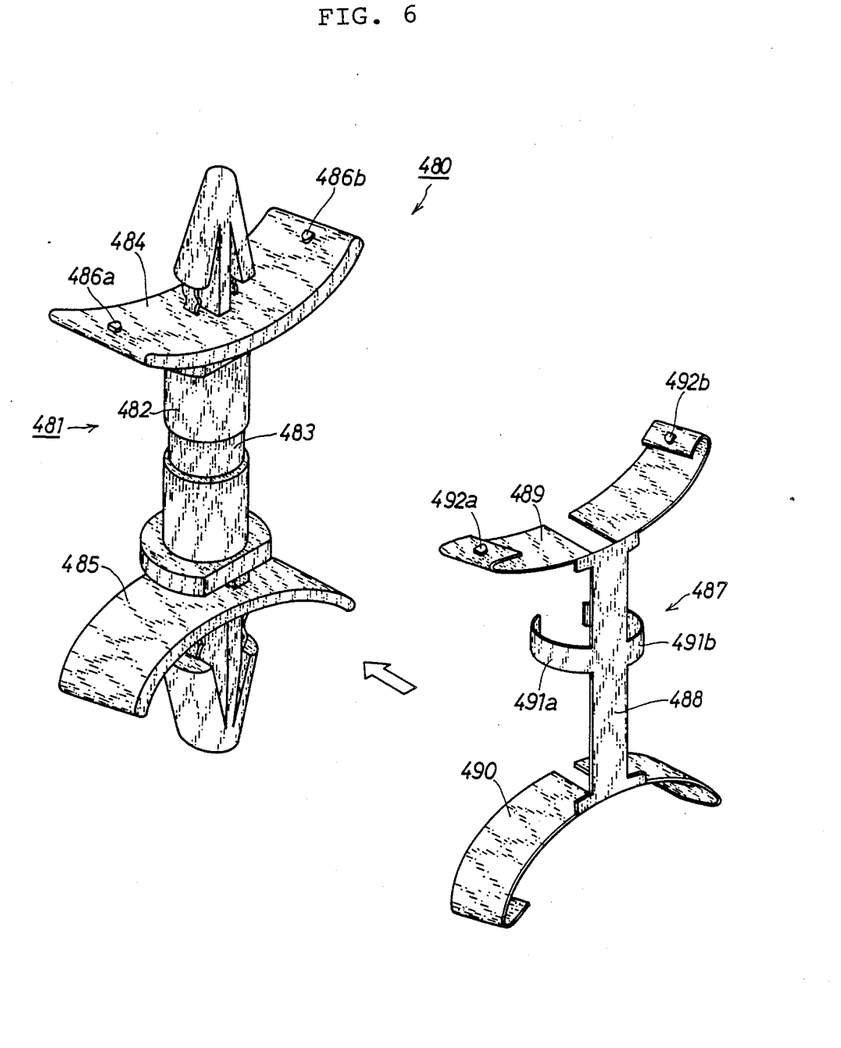
FIG. 6 is an assembly diagram of a fifth embodiment.

A fifth embodiment is explained referring to FIG. 6. A spacer body 481 of a conductive spacer 480 comprises a column 482 that is longer and thicker than that of the spacer body 371 for the fourth embodiment. The column 482 has an annular groove 483 at its center, and braces 484 and 485 with projections 486a and 486b at both ends. Brace clips 489 and 490 extend from the ends of a vertical contact 488 of a conductive member 487, and arms 491a and 491b and extend from the center of the vertical contact 488. Engaging portions 492a and 492b on the brace clips 489 and 490 of the conductive member 487 engage the projections 486a and 486b on the braces 484 and 485.

When the conductive member 487 is attached to the spacer body 481, the arms 491a and 491b of the conductive member 487 enter the groove 483 in the column 482, fixing the vertical contact 488 of the conductive member 487 to the column 482. By engaging the engaging portions 492a and 492b on clips 489 and 490 with the projections 486a and 486b on the braces 484 and 485, the conductive member 487 is firmly secured to the spacer body 481.

Figure 7:
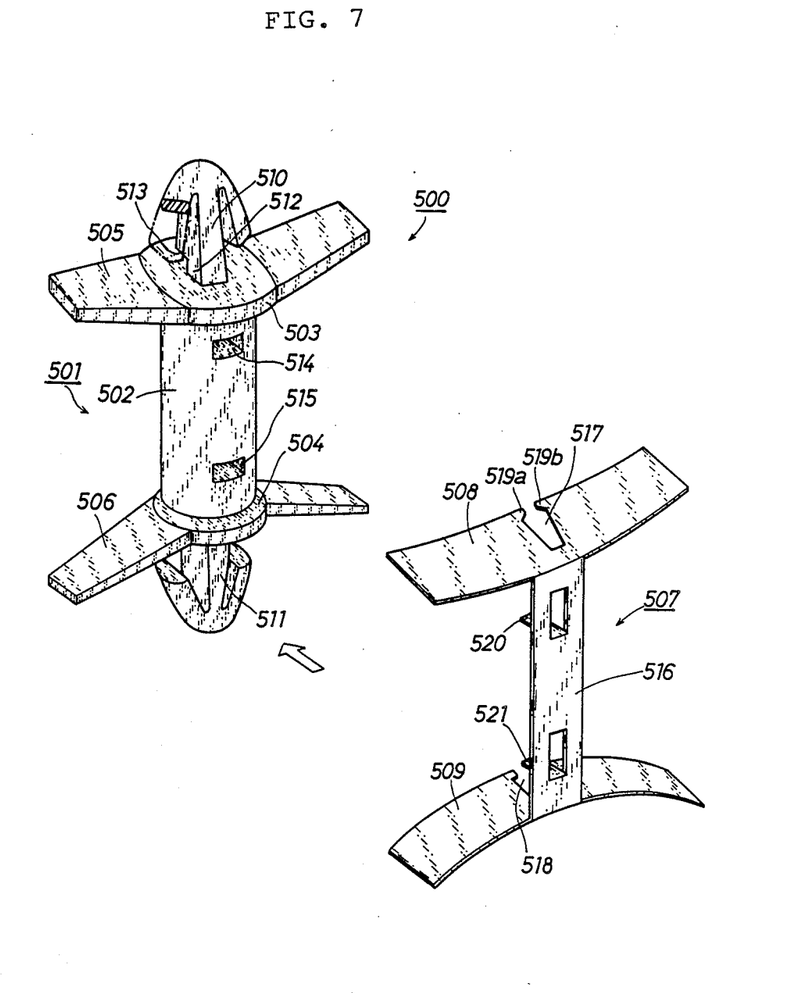
FIG. 7 is an assembly diagram for a sixth embodiment.

A sixth embodiment is explained referring to FIG. 7. A spacer body 501 of a conductive spacer 500 comprises a column 502, and bases 503 and 504 on the respective ends of the column 502. Unlike the other embodiments, braces 505 and 506 extend directly from the bases 503 and 504. Clips 508 and 509 of a conductive member 507 clip on above the brace 505 and below the brace 506, respectively.

Shafts 510 and 511 on the bases 503 and 504 have notches 513 at their roots 512. The column 502 has holes 514 and 515 in its side.

Clips 508 and 509 extend from the both ends of a vertical contact 516 of the conductive member 507. Unlike the other embodiments, the edges of the clips 508 and 509 are not folded. The clips 508 and 509 have notches 517 and 518 in their centers to engage the shafts 510 and 511, respectively. Projections 519a and 519b that jut out into the notches 517 and 518 engage the notches 513 in the shafts 510 and 511, respectively. The conductive member 507 has flaps 520 and 521 that project from the vertical contact 516 to engage the holes 514 and 515 in the column 502 of the spacer body 501.

The protrusions 519a and 519b and the flaps 520 and 521 firmly fix the conductive member 507 to the spacer body 501. The conductive member 507 thus will not easily disengage from the spacer body 501.

Figure 8:
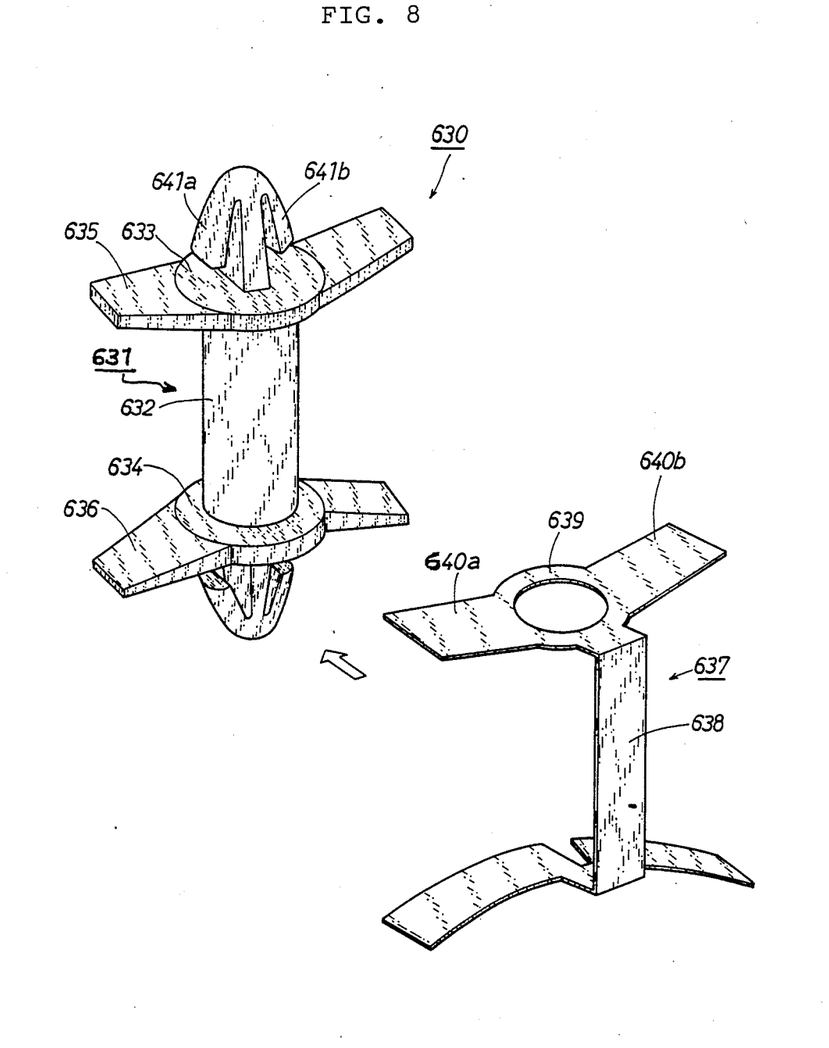
FIG. 8 is an assembly diagram for a seventh embodiment.

A seventh embodiment is explained referring to FIG. 8. A conductive spacer 630 for the seventh embodiment is similar to the conductive spacer 500 for the sixth embodiment in its basic structure. A spacer body 631 of the conductive spacer 630 comprises a column 632, and bases 633 and 634 on the respective ends of the column 632. Braces 635 and 636 extend directly from the bases 633 and 634. However, a conductive member 637 comprises a vertical contact 638, an annular engaging portion 639 on the upper end of the vertical contact 638, and flaps 640a and 640b extending from the engaging portion 639. Arrowhead arms 641a and 641b of the spacer body 631 pass through the engaging portion 639, and spring outward again to engage the conductive member 637. Once the conductive member 637 is attached to the spacer body 631, the conductive member 637 cannot be easily disengaged from the spacer body 631.

Figure 9:
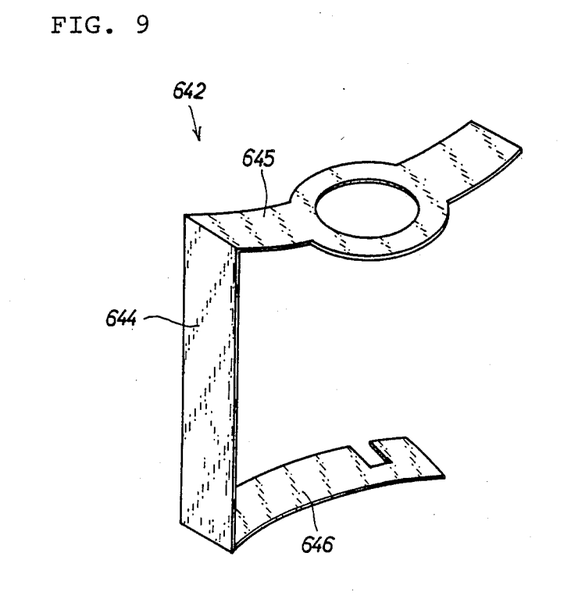
FIGS. 9 and 10 are perspective views of additional conductive member designs for the seventh embodiment.
Figure 10:
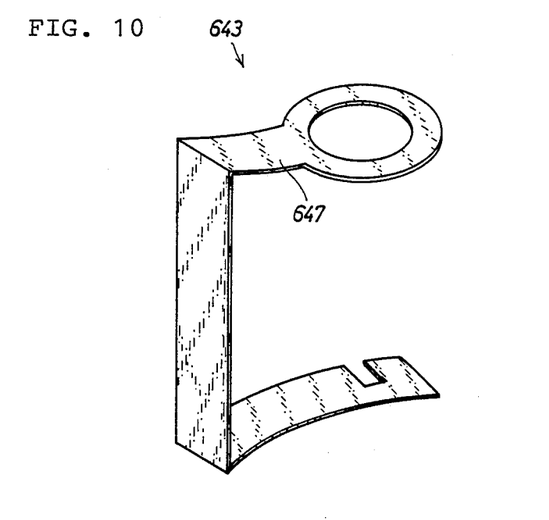

In addition to the conductive member 637 in FIG. 8, conductive members 642 and 643 shown in FIGS. 9 and 10, respectively, could be used with the seventh embodiment. With the conductive member 642 in FIG. 9, flaps 645 and 646 extend from the ends of a vertical contact 644. The lower flap 646 uses less material than the equivalent of the conductive member 637, so weight and cost can be reduced.

The conductive member 643 in FIG. 10 has an upper flap 647 shorter than the flap 645 in FIG. 9, thus saving material and reducing weight.

Figure 11:
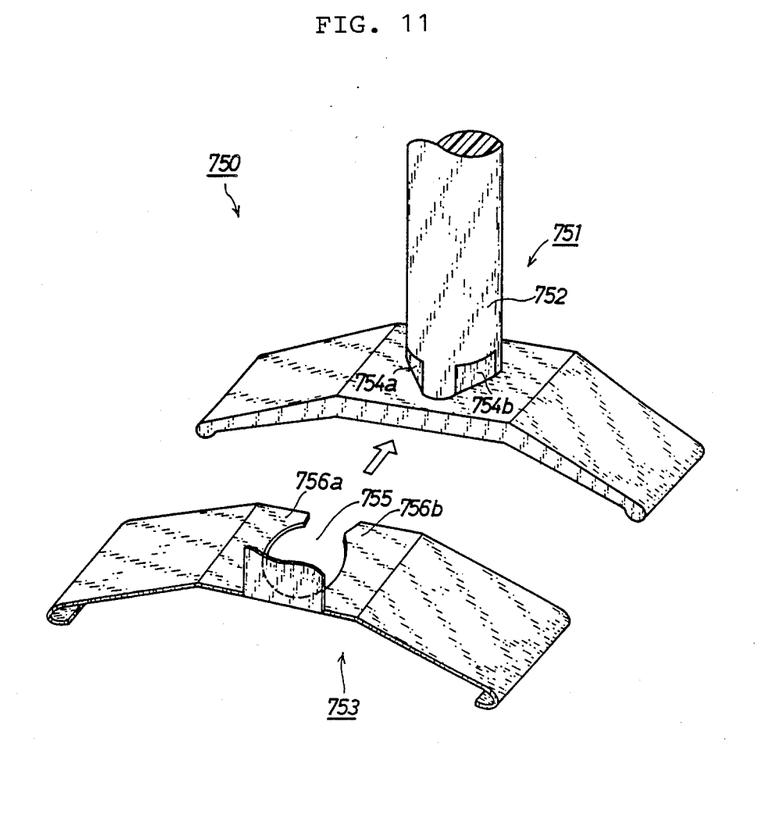
FIG. 11 is a partial assembly diagram for an eighth embodiment.

An eighth embodiment is explained referring to FIG. 11. A spacer body 751 of a conductive spacer 750 comprises a column 752, and grooves 754a and 754b in the foot of the column 752 for receiving a conductive member 753. The conductive member 753 has a keyhole-shaped engaging notch 755 that corresponds in its configuration to the grooves 754a and 754b. The conductive member 753 can thus easily engage the spacer body 751. Projections 756a and 756b, which jut into the engaging notch 755, clip onto the column 752, preventing the conductive member 753 from disengaging from the spacer body 751.

Figure 12:
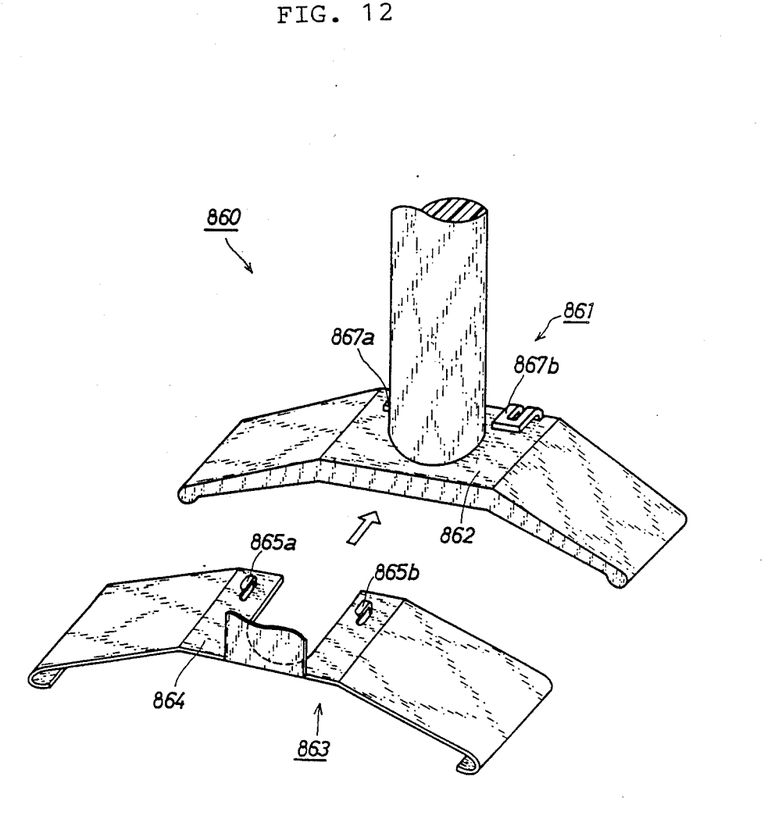
FIG. 12 is an assembly diagram for a ninth embodiment.

A ninth embodiment is explained referring to FIG. 12. A spacer body 861 of a conductive spacer 860 comprises a base 862, and eyes 867a and 867b on the base 862 for receiving hooks 865a and 865b on a clip 864 of a conductive member 863. When the conductive member 863 is attached to the spacer body 861 the hooks 865a and 865b engage the eyes 867a and 867b, fixing the clip 864 to the base 862 so the conductive member 863 cannot disengage from the spacer body 861.

These embodiments can be combined. The conductive member of the conductive spacer for the embodiments can be made by bending copper plate to a desired configuration. The members of the conductive spacer other than the conductive member are molded as one piece from synthetic resin that is light weight and resilient.

Although specific embodiments of the invention have been shown and described for the purpose of illustration, the invention is not limited to the embodiments illustrated and described, but in its broadest aspects includes all embodiments and modifications that come within the scope of the claims.

What I claim is:

1. A conductive board spacer for insertion between first and second boards comprising a body having a spacing member for maintaining a fixed distance between the first and second boards and fixing members provided on ends of the spacing member for engaging the conductive spacer with the boards;
   the fixing members comprising first and second supporting members for pressing against and supporting inner surfaces of the first and second boards, and locking means extending from the first and second supporting members for securely locking the first and second boards onto the first and second supporting members, respectively;
   the conductive spacer further including a conductive member in which a first end of the conductive member contacts the first supporting member and the inner surface of the first board when attached to the first board such that the first end of the conductive member is securely held between the first supporting member and the inner surface of the first board, and a second end of the conductive member extends towards and contacts the second board when the conductive board spacer is inserted between the first and second boards.

2. A board spacer as in claim 1, in which:
   the body is made of nonconductive material; and
   the conductive member is a separate piece that can be fixed to the body.

3. A board spacer as in claim 2 in which the first end of the conductive member has at least one branch that clips onto the first supporting member.

4. A board spacer as in claim 3 in which a hook on the branch can be wrapped around an edge of the supporting member so that the hook lies between the supporting member and the first board adjacent to the supporting member.

5. A board spacer as in claim 3 in which the second end of the conductive member remote from the branch extends parallel to the axis of the spacing member so that the second end can contact the second board when the board spacer is inserted between the first and second boards.

6. A board spacer as in claim 3 in which the second end of the conductive member has at least one branch that clips onto the second supporting member.

7. A board spacer as in claim 2 in which the conductive member has arms that embrace the spacing member.

8. A board spacer as in claim 2 in which
   the body has button-like protrusions; and
   the conductive member has holes for engaging those protrusions.

9. A board spacer as in claim 2 in which the conducting member has at least one clip that conforms to the shape of a cross-section normal to the longitudinal axis of a fixing member for clipping the conductive member to the body.

10. A board spacer as in claim 9 in which the body has grooves that facilitate the installation of the clip.

11. A board spacer as in claim 2 in which the conducting member has at least one clip that conforms to the shape of a cross-section normal to the longitudinal axis of the spacing member for clipping the conductive member to the body.

12. A board spacer as in claim 11, in which the body has grooves that facilitates the installation of the clip.

13. A board spacer as in claim 2 in which the conductive member has at least one branch that lies between a supporting member and a board adjacent to the supporting member.

14. A board spacer as in claim 2 in which
   the body has at least one slot, and
   the conductive member has at least one flap that fits into the slot for securing the conductive member to the body.

15. A board spacer as in claim 2 in which
   the body has at least one loop, and
   the conductive member has at least one hook for engaging the loop for securing the conductive member to the body.

16. A board spacer as in claim 1 in which the second end of the conductive member contacts the second board between the second supporting member and the inner surface of the second board such that the second end of the conductive member is securely held between the second supporting member and the inner surface of the second board when the board spacer is inserted between the first and second boards.

17. A board spacer as in claim 1, wherein the locking means on the first and second supporting members extend from the centers of the first and second supporting members along the longitudinal axis of the spacing member and form detents for passing through holes in the boards and securing outer surfaces of the boards.

18. A board spacer as in claim 17 in which the second end of the conductive member is annular, and fits over and locks under at least one of the detents of the locking means of the first and second supporting members.

19. A conductive board spacer for insertion between boards comprising a body made of nonconductive material, said body including a spacing member for maintaining a fixed distance between the boards and fixing members provided on ends of the spacing member for engaging the conductive spacer with the boards;
- the fixing members comprising supporting members for pressing against and supporting inner surfaces of the boards, and locking members extending from the centers of the supporting members along the longitudinal axis of the spacing member and forming detents for passing through holes in the boards and securing outer surfaces of the boards;
- the conductive spacer further including a conductive member, which is a separate piece that can be fixed to the body, wherein one end of the conductive member contacts a lower board where lower supporting members press the inner surface of the lower board, and the other end of the conductive member extends toward and contacts an upper board when the board spacer is inserted between upper and lower boards;
- wherein said body includes button-like protrusions and said conductive-member includes holes for engaging said protrusions.

20. A conductive board spacer for insertion between boards comprising a body made of nonconductive material, said body including a spacing member for maintaining a fixed distance between the boards and fixing members provided on ends of the spacing member for engaging the conductive spacer with the boards;
- the fixing members comprising supporting members for pressing against and supporting inner surfaces of the boards, and locking members extending from the centers of the supporting members along the longitudinal axis of the spacing member and forming detents for passing through holes in the boards and securing outer surfaces of the boards;
- the conductive spacer further including a conductive member, which is a separate piece that can be fixed to the body, wherein one end of the conductive member contacts a lower board where lower supporting members press the inner surface of the lower board, and the other end of the conductive member extends toward and contacts an upper board when the board spacer is inserted between upper and lower boards, one end of said conductive member having at least one branch that clips onto at least one supporting member, a section of the conductive member remote from the branch being annular, and fitting over and locking under at least one of the detents.

21. A conductive board spacer for insertion between boards comprising a body made of nonconductive material, said body including a spacing member for maintaining a fixed distance between the boards and fixing members provided on ends of the spacing member for engaging the conductive spacer with the boards;
- the fixing members comprising supporting members for pressing against and supporting inner surfaces of the boards, and locking members extending from the centers of the supporting members along the longitudinal axis of the spacing member and forming detents for passing through holes in the boards and securing outer surfaces of the boards;
- the conductive spacer further including a conductive member, which is a separate piece that can be fixed to the body, wherein one end of the conductive member contacts a lower board where lower supporting members press the inner surface of the lower board, and the other end of the conductive member extends toward and contacts an upper board when the board spacer is inserted between upper and lower boards;
- said body having at least one loop, and the conductive member having at least one hook for engaging the loop for securing the conductive member to the body.

* * * * *